(12) United States Patent  
Couchaud et al.

(10) Patent No.: US 8,216,926 B2  
(45) Date of Patent: Jul. 10, 2012

(54) METHOD OF PRODUCING A PARTLY OR COMPLETELY SEMI-INSULATING OR P-TYPE DOPED ZNO SUBSTRATE, SUBSTRATES OBTAINED, AND ELECTRONIC, ELECTRO-OPTIC OR OPTOELECTRONIC DEVICES COMPRISING THEM

(75) Inventors: Maurice Couchaud, Izeron (FR); Céline Chevalier, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 407 days.

(21) Appl. No.: 12/536,897

(22) Filed: Aug. 6, 2009

(65) Prior Publication Data

US 2010/0200850 A1    Aug. 12, 2010

(30) Foreign Application Priority Data

Aug. 14, 2008    (FR) .................................... 08 55598

(51) Int. Cl.
*H01L 21/22*    (2006.01)
*H01L 21/38*    (2006.01)
(52) U.S. Cl. ........ 438/557; 438/403; 438/479; 438/537; 438/542; 438/546
(58) Field of Classification Search .................. 438/403, 438/479, 537, 542, 546, 557
See application file for complete search history.

(56) References Cited

U.S. PATENT DOCUMENTS

| 6,936,101 | B2 | 8/2005 | Nause et al. | |
| 7,691,353 | B2 * | 4/2010 | Burgener et al. | 423/265 |
| 7,723,154 | B1 * | 5/2010 | Adekore et al. | 438/104 |

FOREIGN PATENT DOCUMENTS

EP    0 338 252 A1    10/1989

OTHER PUBLICATIONS

Meyer et al., "Shallow Donors and Acceptors in ZnO", Semiconductor Science and Technology, vol. 20, XP-002522877, No. 4, (IOP Publishing Ltd., 2005), pp. S62-S66.

Wang et al., "Optical Properties of P-Type ZnO Doped by Lithium and Nitrogen", Solid State Communications, vol. 141, No. 11, dated Feb. 13, 2007, pp. 600-604.

Xing et al., "Effect of Annealing on Conductivity Behavior of Undoped Zinc Oxide Prepared by RF Magnetron Sputtering", Journal of Alloys and Compounds, vol. 457, No. 1-2, dated Jun. 12, 2008, pp. 36-41.

Paul H. Kasai, "Electron Spin Resonance Studies of Donors and Acceptors in ZnO", Physical Review, vol. 130, No. 3, dated May 1, 1963, pp. 989-995.

Garces et al., "Thermal Diffusion of Lithium Acceptors into ZnO Crystals", Journal of Electronic Materials, vol. 32, No. 7, 2003, pp. 766-771.

* cited by examiner

*Primary Examiner* — Bac Au
(74) *Attorney, Agent, or Firm* — Miles & Stockbridge P.C.

(57) ABSTRACT

Method of producing a partly or completely semi-insulating or p-type doped ZnO substrate from an n-type doped ZnO substrate, in which the n-type doped ZnO substrate is brought into contact with an anhydrous molten salt chosen from anhydrous molten sodium nitrate, lithium nitrate, potassium nitrate and rubidium nitrate. Partly or completely semi-insulating or p-type doped ZnO substrate, said substrate being in particular in the form of a thin layer, film or in the form of nanowires; and said substrate being doped at the same time by an element chosen from Na, Li, K and Rb; by N; and by O; it being furthermore possible for ZnO or GaN to be epitaxially grown on this substrate. Electronic, optoelectronic or electro-optic device such as a light-emitting diode (LED) comprising this substrate.

12 Claims, 1 Drawing Sheet

METHOD OF PRODUCING A PARTLY OR COMPLETELY SEMI-INSULATING OR P-TYPE DOPED ZNO SUBSTRATE, SUBSTRATES OBTAINED, AND ELECTRONIC, ELECTRO-OPTIC OR OPTOELECTRONIC DEVICES COMPRISING THEM

TECHNICAL FIELD

The invention relates to a method of producing a partly or completely, totally, semi-insulating or p-type doped ZnO substrate.

The invention furthermore relates to partly or completely, totally, semi-insulating or p-type doped ZnO substrates.

These substrates may in particular be applicable in the fabrication of electronic, electro-optic or optoelectronic devices and may serve, for example, for the fabrication of light-emitting diodes for lighting, after epitaxy on these substrates of "large gap" materials such as ZnO and GaN.

The technical, field of the invention may therefore be defined in general as that of production and fabrication of at least partly semiconductor or p-type doped ZnO substrates from commercial ZnO substrates which in general are naturally n-type doped.

PRIOR ART

There is great interest in fabricating light-emitting diodes for illumination with low energy consumption.

The use of a large-gap material such as zinc oxide ZnO or gallium nitride GaN may allow high-performance diodes to be obtained.

One of the steps in the fabrication of these diodes is the epitaxy of such n-type doped large-gap materials on suitable p-type doped substrates.

At the present time, the substrates used most often for GaN epitaxy are sapphire substrates, but these generate strains and dislocations prejudicial to the efficiency of the diodes.

Sapphire substrates are also used for ZnO epitaxy, but the method has yet to be optimized.

The expitaxy of n-type doped ZnO or GaN is completely understood and it would be advantageous to be able to carry it out on other substrates, and especially on ZnO substrates.

This is because, in the case of ZnO epitaxy, the homoepitaxy thus carried out would make it possible to preserve, in the epitaxially grown ZnO film, layer, the crystalline quality of the substrate, which is also made of ZnO, without creating dislocations due to the strains generated by the lattice mismatch between the epitaxially grown layer, film, and the substrate, characteristic of heteroepitaxy.

In the case of GaN epitaxy, the use of a ZnO substrate enables the strains to be limited, since the lattice mismatch is only 3%.

However, the main difficulty—the principal obstacle in the epitaxy of materials such as n-type doped ZnO and GaN on a ZnO substrate—in particular for the production of diodes, lies in the fact that it is extremely difficult to produce p-type doped ZnO substrates. In other words, p-doping of ZnO is very complicated because the natural conductivity of ZnO is n-type. Currently, commercial substrates made of zinc oxide ZnO are mostly obtained from crystals grown by the hydrothermal synthesis method, which makes it possible to obtain the largest sizes and the best crystalline quality. These crystals are naturally n-doped. Several documents mention methods for converting a substrate made of ZnO having n-type conductivity into a semi-insulating substrate or a substrate having p-type conductivity. Thus, document U.S. Pat. No. 6,936,101 B2 [1] discloses a method of producing a semi-insulating ZnO single crystal following a Bridgman growth technique from a molten mass of ZnO. This growth technique is complex and allows only very limited semi-insulating ZnO substrates to be obtained. The document "*Shallow Donors and Acceptors in ZnO*", Semiconductor Science and Technology, 2005, Vol. 20, No. 4, April 2005, S62-S66, by B. K. Meyer et al. [2] describes a way of modifying the conductivity of ZnO by in situ nitrogen implantation, diffusion and doping. The diffusion of nitrogen into ZnO is achieved using thermal decomposition of lithium nitrate and ammonium nitrate at temperatures ranging between 500 and 800° C. Lithium nitrate allows the incorporation of nitrogen into the ZnO after the nitrate has undergone thermal decomposition above 600° C. The document "*Electron Spin Resonance Studies of Donors and Acceptors in ZnO*", Physical Review, Vol. 130, No.3, 1 May 1963, 989-995, by P. H. Kasai [3] describes the production of ZnO specimens by heating a fine ZnO powder at 900° C. for two hours. Acceptors and donors are introduced by adding, to the ZnO powder, an aqueous solution of an alkaline metal halide or nitrate, such as lithium nitrate, before the heating. Both in document [2] and in document [3], the integrity of the surfaces of the ZnO substrates is not preserved, and is degraded. The document "*Thermal diffusion of Lithium Acceptors into ZnO Crystals*", Journal of Electronic Materials, Vol. 32, No. 7, 2003, 766-771 by N. Y. Garces et al. [4] relates to the thermal diffusion of lithium acceptors into ZnO crystals. A ZnO crystal placed in a small ceramic boat is completely surrounded by LiF powder and subjected to a series of annealing operations at a temperature of 750° C., i.e. below the melting point of LIP, namely 845° C. In the above document, the diffusion of the elements cannot be homogeneous since the contact of the LiF powder and ZnO cannot be uniform over the entire ZnO substrate. All the above methods also have the drawback of being carried out at elevated temperatures.

SUMMARY OF THE INVENTION

In view of the foregoing, there is therefore a need for a method of producing an at least partly semi-insulating or p-type doped ZnO substrate from an n-type doped ZnO substrate, which avoids any degradation of the surface of the produced substrate, any damage to this substrate, and which enables the conductivity to be homogeneously modified, irrespective of the shape and size of the substrate.

Furthermore, there is a need for such a method to be simple and reliable, to be easy to implement and to use relatively low temperatures.

One aim of the invention is to provide a method of producing an at least partly semi-insulating or p-type doped ZnO substrate from an n-type doped ZnO substrate, which meets inter alia the abovementioned needs.

Another aim of the invention is to provide a method of producing an at least partly semi-insulating or p-type doped ZnO substrate from an n-type doped ZnO substrate which does not have the drawbacks, defects, limitations and disadvantages of the methods of production of the prior art such as those described above and which solves the problems of these methods.

These aims, and yet others, are achieved, in accordance with the invention, by a method of producing a partly or completely semi-insulating or p-type doped ZnO substrate from an n-type doped ZnO substrate, in which the n-type doped ZnO substrate is brought into contact with an anhydrous molten salt chosen from anhydrous molten sodium nitrate, lithium nitrate, potassium nitrate and rubidium nitrate.

The contacting may generally be carried out at a molten salt temperature of 264° C. to 600° C., preferably 350 to 500° C., especially when the salt is anhydrous lithium nitrate.

The contacting may be carried out for a time of 5 minutes to 24 hours, and preferably 5 hours, especially when the salt is anhydrous lithium nitrate.

Advantageously, the molten salt is subjected to a dehydration heat treatment prior to, and preferably immediately before, the contacting.

Advantageously, this dehydration heat treatment is carried out prior to the contacting, and preferably until same, by bringing the molten salt up to a sufficient temperature and by keeping this sufficient temperature constant for a time sufficient for the salt to be made anhydrous.

This "sufficient" temperature is generally from 450 to 500° C.

This "sufficient" time is generally from 24 hours to 48 hours.

The contacting may generally be carried out by immersing the n-type doped ZnO substrate in the anhydrous molten salt.

The method according to the invention may be defined as a method for easily modifying the conductivity of a ZnO substrate of n-type conductivity by converting it into a semi-insulating substrate or into a substrate of p-type conductivity with a very simple diffusion technique in liquid medium.

It may be stated that, according to the invention, an anhydrous liquid is used which comprises the elements that make it possible to compensate for the n-type conductivity and to promote the incorporation of acceptors necessary for p-type conductivity.

For example in the case of a liquid such as lithium nitrate $LiNO_3$, these elements are lithium Li if it is to substitute for zinc, nitrogen N if this is to substitute for oxygen, or oxygen if this is to fill the oxygen vacancies.

The method according to the invention has never been described in the prior art.

The method according to the invention differs fundamentally from the methods of the prior art in particular in the use of a liquid, and moreover anhydrous, molten salt to achieve this modification, transformation.

Specifically in document [2], lithium nitrate is thermally decomposed in a sealed ampoule so as to give $Li_2O+NO_2+H_2O$ (i.e. hydrated nitrate) and only the nitrogen of gaseous $NO_2$ diffuses into the ZnO, whereas in document [3] $LiNO_3$ is also in aqueous solution and only ZnO powders are treated.

Unlike the methods described in these documents [2] and [3], the method according to the invention employs a salt in molten, liquid form, this being especially lithium nitrate or sodium nitrate, and not an aqueous solution, the salt remaining in liquid, molten form throughout the method and not being thermally decomposed so as to generate water.

Unlike the method described in document [4], the invention employs a liquid, molten salt chosen from four specific salts and preferably from two specific salts, $LiNO_3$ and $NaNO_3$, and not an LiF powder.

The method according to the invention meets inter alia the abovementioned needs, does not have the drawbacks, defects, limitations and disadvantages of the methods of the prior art and provides a solution to the problems of these methods.

The method according to the invention is very simple, is easy to implement and comprises in fact only a single essential step, namely that of bringing the substrate, such as a commercial zinc oxide substrate of n-type conductivity, into contact, for example by immersion, with the molten salt, during which step the substrate is converted into a substrate of p-type conductivity by diffusion of the elements contained in the liquid.

The method according to the invention does not require complicated or expensive equipment for its implementation.

In the method according to the invention, the molten salt is anhydrous, i.e. free of water, and produces no water during the method, thereby making it possible to preserve the integrity of the surfaces of the ZnO substrates and to avoid any damage to them, unlike the methods such as those of documents [2] and [3].

On account of the fact that ZnO is slightly soluble in water and that for example $LiNO_3$ is hygroscopic and easily hydrated, it is advantageous to dehydrate the salt, such as $LiNO_3$, by heating it for example under the abovementioned conditions before bringing it into contact with the ZnO substrate for the diffusion.

Furthermore, the liquid state of the molten salt, such as lithium nitrate, used according to the invention ensures that there is uniform contact over the entire surface of the ZnO substrate and homogeneous diffusion of the elements, something which is not possible with a salt powder as in document [4].

This homogeneous diffusion of the elements, irrespective of the size and shape of the ZnO substrate, obtained thanks to the use according to the invention of a liquid, molten salt, is one of the major advantages of the method according to the invention.

The method according to the invention, because of the specific salts that have been chosen, may be implemented at low temperature. This results in substantial savings in terms of energy consumption.

In other words, in the method according to the invention, the diffusion may take place at low temperature since, for example, the melting point of $LiNO_3$ is 264° C., the melting point of $NaNO_3$ is 309° C., the melting point of rubidium nitrate $RbNO_3$ is 309° C., and the melting point of potassium nitrate $KNO_3$ is 334° C.

The three constituent elements of lithium nitrate have a favourable effect on the p-type doping of ZnO by the diffusion of lithium, nitrogen and oxygen.

The oxygen O has an oxidizing effect that may possibly compensate for the oxygen vacancies (which are assumed to give the n-type conduction), the lithium Li may compensate for the donors present, by playing the role of acceptor as substitution for the zinc, and the nitrogen N plays the role of acceptor as substitution for the oxygen.

Furthermore, the ZnO substrate is not damaged by the $LiNO_3$, since ZnO is insoluble in molten $LiNO_3$, and $LiNO_3$ may be rapidly and easily removed, for example by dissolving it, for example in water or an alcohol.

Nor is the ZnO substrate, as mentioned above, damaged or degraded by water since the molten salt is anhydrous.

Another advantage of the method according to the invention is that the diffusion may be controlled by the temperature of the liquid and by the duration of the contacting, immersion of the substrate in the liquid.

This diffusion control is extremely advantageous as it makes it possible to control the diffusion depth, unlike in other techniques.

Thus, it is possible to produce p-doped ZnO as a thin layer or with a greater thickness, for example over the entire thickness of the ZnO substrate used, which may for example be 500 µm.

The method according to the invention may be used to convert only a surface film, layer, preferably of defined thickness, of the n-type doped ZnO substrate into a p-type doped ZnO substrate, or else all of the (the entire) n-type doped ZnO substrate into p-type doped ZnO.

This film, layer may be a thin layer, film, for example with a thickness of 500 nm to 1 micron.

The method according to the invention makes it possible for the first time to produce a partly or completely semi-insulating or p-type doped ZnO substrate, the p-type behaviour of which is effectively proven and demonstrated. In this regard, the reader may refer to the example provided.

The method according to the invention makes it possible for the first time to produce a partly or completely (totally) semi insulating or p-type doped ZnO substate, said substrate being doped at the same time by an element selected from Na, Li, K and Rb; by N; and by O.

Another subject of the invention is therefore a partly or completely semi-insulating or p-type doped ZnO substrate characterized in that said substrate is doped at the same time by an element selected from Na, Li, K, and Rb; by N; and by O.

Such a substrate, doped at the same time, simultaneously by an element selected, chosen, from Na, Li, K and Rb ; by N; and by O, and more particularly a substrate doped at the same time, simultaneously, by the three elements Li, N and O, is intrinsically novel and has never seen disclosed nor suggested in the prior art.

A simultaneous doping by an element selected, chosen from Na, Li, K and Rb; by N; and by O, and more particularly a simultaneous doping by the three elements Li, N and O is, as already mentioned, very beneficial because each of said elements has a favourable effect on the p-type doping of ZnO.

This substrate may take the form of a 2D thin layer or film or the form of nanowires.

This substrate may also take the form of an n-type ZnO substrate, for example a solid, bulk, monolithic substrate, a surface layer, film, preferably of defined thickness, of which has been converted into p-type doped ZnO after carrying out the method according to the invention.

This surface layer, film may be a thin layer, film as defined above.

Such a substrate or structure is intrinsically novel and has never been described nor suggested in the prior art.

Such a compact monoblock, one piece, structure has optical and electrical properties that are modified over a thickness of between 500 nm and 1 μm. Such properties have hitherto not been obtained in the prior art.

The method according to the invention thus makes it possible to create acceptors having different optical and electrical properties over a given, defined thickness from a monolithic, solid, bulk ZnO substrate, which is naturally n-type doped, not (intentionally) n-type doped.

It is thus possible for a p-n junction to be easily produced by a simple method, directly from a simple monolithic substrate, without for example requiring multiple growth steps.

Furthermore, n-type doped GaN or ZnO may be epitaxially grown on the substrate according to the invention.

The invention also relates to an electronic, optoelectronic or electro-optic device comprising the substrate according to the invention.

In particular, this device is a light-emitting diode (LED) and in particular a UV LED.

The invention will be better understood upon reading the following detailed description, which is given by way of illustration but implies no limitation.

BRIEF DESCRIPTION OF THE DRAWINGS

The detailed description is given with reference to the appended drawings, in which.

The black squares represent the Hall density for the naturally n-type ZnO substrate; the light grey squares represent the Hall density for the substrate produced as in Example 1, the measured conductivity being of n-type; and the light grey stars represent the Hall density for the substrate produced as in Example 1, the measured conductivity being of p-type.

Figure 2:
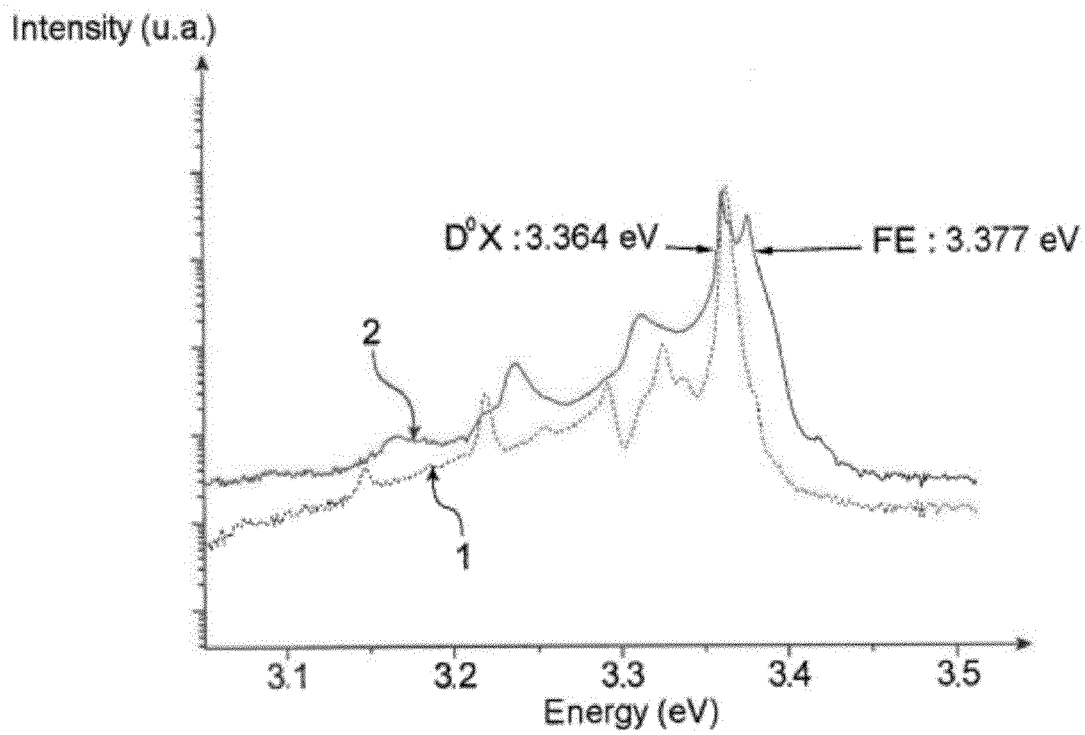

FIG. 2 is a graph showing the photoluminescence spectrum (dotted curve 1) of a naturally n-type ZnO specimen or substrate and the photoluminescence spectrum (continuous curve 2) of the specimen or substrate produced as in Example 1. The intensity (in arbitrary unit u.a.) is plotted on the y-axis and the energy (in eV) is plotted on the x-axis.

DETAILED DESCRIPTION OF PREFERRED EMBODIMENTS

The method according to the invention is a method of producing an at least partly semi-insulating or p-type doped ZnO substrate from an n-type doped ZnO substrate, in which an n-type doped ZnO substrate is brought into contact with an anhydrous molten salt chosen from sodium nitrate, lithium nitrate, potassium nitrate and rubidium nitrate.

The starting substrate is an n-type doped ZnO substrate.

The expression "n-type doped substrate" is understood to mean a substrate that naturally has, intrinsically, this n-type conductivity.

This means that the ZnO has not been intentionally or purposely n-doped, rather it has this n-type conductivity intrinsically or inherently, for example as a result of its method of production, by hydrothermal synthesis, for example, and is thus used, as commercially available, without undergoing n-type doping.

In general, the starting substrate is a substrate which may be called a bulk, solid, monolithic substrate, as opposed to a pulverulent substrate.

The starting substrate may have any shape and any size.

This is because, thanks to the method according to the invention, it is possible to treat large substrates and/or substrates of complex shapes with equal success.

The substrate according to the invention may thus take the form of a square, with dimensions of $10 \times 10$ $mm^2$, or a disc of 20 mm diameter, these being shapes of commercially available substrates.

This substrate may have a thickness ranging from one hundred to a few hundred microns, namely for example 200, 300, 400, 500 or 1000 μm.

In general, the substrate has a thickness of about 500 μm.

It is possible, with the method according to the invention, to produce a single substrate or else several substrates simultaneously.

In accordance with the invention, the n-type doped ZnO starting substrate is brought into contact with a liquid, molten salt, which is molten sodium nitrate, potassium nitrate, rubidium nitrate or lithium nitrate.

The preferred salt is lithium nitrate.

Lithium nitrate melts at a temperature of 264° C. (537.15 K) and remains liquid up to 600° C. (875.15 K), at which temperature it decomposes. Diffusion of the elements in lithium nitrate into the ZnO can therefore take place within the 264° C. to 600° C. range, preferably the 350° C. to 500° C. range.

Lithium nitrate is the preferred salt since the Li ion, which is smaller, diffuses more easily into ZnO and should preferably be used.

The nitrates of other alkaline metal elements of group I, such as sodium (Na), potassium (K) and rubidium (Rb), may also be used, but the diffusion of sodium, potassium and rubidium ions, which are increasingly larger, is more difficult.

Moreover, sodium nitrate $NaNO_3$, which melts at 309° C. (582.15 K) and remains liquid up to 538° C. (811.15 K) may decompose with a risk of explosion, whereas $KNO_3$, which is liquid at 334° C. decomposes as soon as it reaches 400° C.

The contacting may take place by immersion.

It is preferable for the entire substrate, namely all its surfaces, to be in contact with the molten salt.

According to the invention, the molten salt is anhydrous, which generally means that its water content is less than 1% by weight.

To be sure that the salt employed is effectively anhydrous, since $LiNO_3$ for example is hygroscopic and easily hydrated, it is preferable, prior to the contacting, preferably immediately before it, to carry out a dehydration heat treatment.

Thus, prior to the contacting, the molten salt may for example be brought to a sufficient temperature, and this sufficient temperature kept constant for a sufficient time until the contacting, so that the salt is anhydrous.

This sufficient temperature and this sufficient time are for example 450 to 500° C. and 24 hours to 48 hours respectively.

During the contacting by immersion, the substrate may undergo a translational and/or rotational movement.

The contacting temperatures and the contacting times have already been mentioned above.

In accordance with the invention, the temperature of the liquid and the contacting time, for example the immersion time, are used to control the diffusion of the species into the substrate and the depth of diffusion. It will thus be possible thanks to the invention to convert the n-type substrate only partly into a p-type substrate, or else completely, totally, into a p-type substrate.

Thus, it will be possible to produce, at the surface of a bulk, solid, monolithic n-type doped ZnO substrate, for example having a starting thickness of 500 microns, a p-type ZnO layer, film of a desired, given, defined thickness, for example a thin layer, film having a thickness ranging from 500 nm to 1 micron.

To obtain a thin layer, film with such a thickness of p-type doped ZnO, the contacting temperature is generally from 350 to 500° C. and the contacting time is generally from 5 minutes to 24 hours.

If it is desired for the entire thickness of this n-type ZnO starting substrate to be converted into p-type doped ZnO, it will be necessary to use a contacting time generally ranging from 350 to 500° C. and a contacting time generally ranging from 1 or 2 hours to 24 hours.

After the contacting operation, the substrate is removed, separated from the molten liquid salt. All the remaining molten salt may be removed by agitating the substrate, for example by rotating it.

The liquid salt may also be removed using water or an alcohol, since $LiNO_3$ may be rapidly dissolved, for example in water or in an alcohol.

A p-type doped ZnO substrate or a 2D thin ZnO layer, film or a nanowire-based substrate may be produced according to the method of the invention.

The ZnO thus produced, being p-type doped throughout the volume or over a thickness controlled by the soaking, immersion, contacting time in the liquid salt such as $LiNO_3$, may serve as substrate for n-type doped ZnO (or GaN) epitaxy (for example by a vapour phase epitaxy technique such as MOCVD). It is obvious that if only a portion of the substrate produced is p-doped, it is clearly on this portion that the n-doped ZnO or GaN epitaxy is carried out.

The complete device thus obtained may be used in electronics, electro-optics or optoelectronics for producing p-n diodes for the fabrication of light-emitting diodes (LEDs). These light-emitting diodes may serve for example for lighting with low energy consumption.

The invention will now be described with reference to the following examples, given by way of illustration but implying no limitation.

EXAMPLE 1

200 g of high-purity lithium nitrate were placed in a quartz crucible.

The whole assembly was placed in a vertical furnace, the temperature of which was computer-controlled. The temperature of the crucible was controlled by a thermocouple. The temperature of the crucible and that of the molten salt bath were the same.

The temperature of the crucible was raised to 500° C., the lithium nitrate melting from 264° C. on and then remaining liquid. The 500° C. temperature was kept constant for a time of 24 hours so as to ensure that the lithium nitrate was anhydrous.

A ZnO substrate (initial substrate) with a natural n-type conductivity (square substrate measuring 10×10 $mm^2$, with a thickness of about 500 μm and a mass of 0.0655 g, of commercial type) was placed on a substrate holder subjected to a translational movement so that the substrate could be immersed in the liquid for the chosen time, in this example for 5 hours.

The temperature of the molten salt was controlled at 350° C. throughout this time.

Next, the substrate was removed from the liquid, the rotation of the substrate holder was stopped and the liquid was drained off.

Next, the substrate was moved translationally out of the furnace. By rapidly rinsing it with deionized water for five seconds, it was possible to remove the residue of solidified salt from the treated substrate.

Lastly, the final substrate, final specimen which was the result of implementing the method according to the invention, was recovered.

Characterization of the final specimen, substrate obtained.

Firstly, it should be noted that no significant variation in weight nor appreciable change in appearance was observed.

Measurement of the Electrical Properties by the Hall Effect in a Variable Magnetic Field The electron density measured on the final substrate was lower (by two orders of magnitude) than that initially measured on the initial substrate.

p-type conductivity was reproducibly measured at 300 K for all the fields (from 0 T to 9 T).

The resistivity of the final substrate increased by two orders of magnitude from that of the initial substrate (~$10^4$ to $10^6$ ohms·cm).

Figure 1:
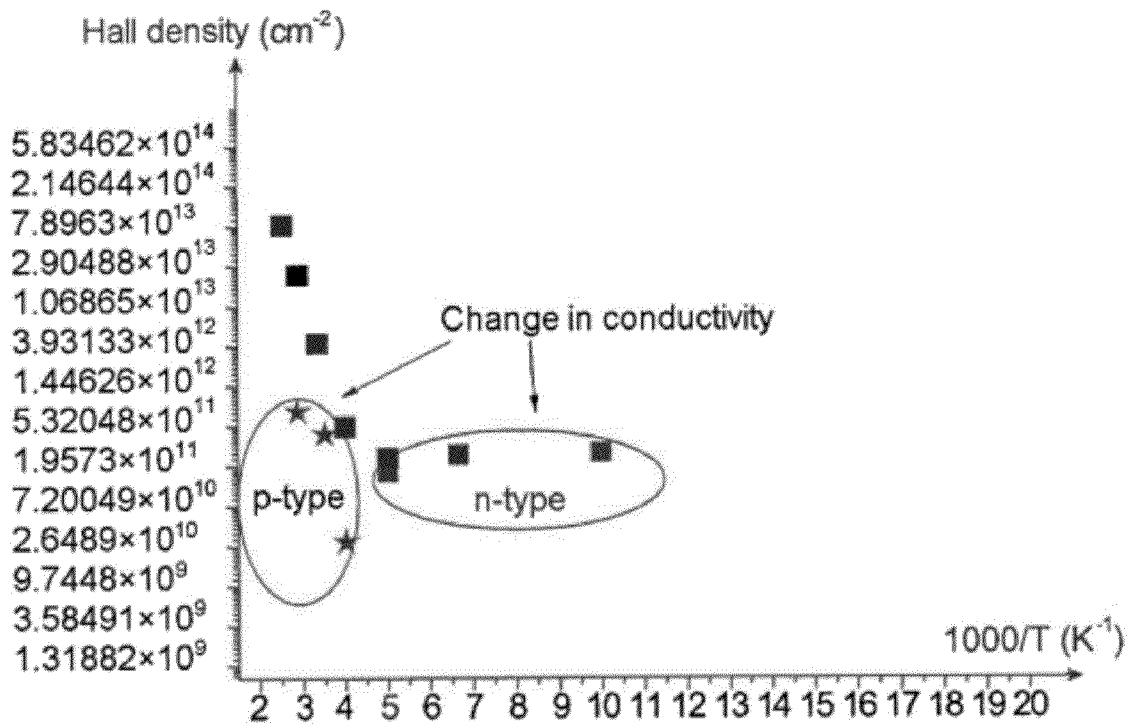
FIG. 1 is a graph showing the measured Hall density (in $cm^{-2}$) as a function of $1000/T$ (in $K^{-1}$) for a naturally n-type ZnO specimen or substrate and for a specimen or substrate produced as in Example 1, in accordance with the method according to the invention in molten $LiNO_3$.

FIG. 1 shows the variation in Hall density measured on the specimen produced in accordance with the method according to the invention, as described above, and that measured on a naturally n-type ZnO substrate, i.e. one that had not been treated by the method according to the invention. This naturally n-type ZnO substrate had the same square shape and the same dimensions as the treated substrate.

The expected p-type conductivity (light grey stars) at 300 K and the change in conductivity of the specimen produced in accordance with the method of the invention, as described above, from n-type conductivity (temperature: 100 to 400 K) to p-type conductivity can be seen.

At 300 K, the mobility obtained on the measured p-type specimen, produced in accordance with the method of the invention, as described above, was about 8 cm²/Vs.

Measurement of the Optical Properties by Photoluminescence (PL)

The photoluminescence spectra of a naturally, intrinsically n-type doped ZnO specimen, substrate and of the final specimen, substrate, produced in accordance with the method of the invention, as described above, were produced.

The two substrates of square shape had the same dimensions (10×10 mm² and a thickness of about 500 μm).

The measurement conditions were the following:
temperature: 4 K;
array: 600 lines;
laser power: 50 microwatts;
slot: 50 microns;
spectrum integration time: 0.01 seconds for the naturally n-type doped substrate and 0.3 seconds for the specimen produced in molten lithium nitrate in accordance with the method of the invention.

FIG. 2 gives the photoluminescence (PL) spectra obtained under the conditions mentioned above for the specimen produced in molten $LiNO_3$, in accordance with the method of the invention (solid curve 2) and for a naturally n-type doped ZnO substrate (dotted curve 1).

The most important result relates to the ratio of the intensity of the peak called $D^0X$ (donor exciton ; exciton bound to a donor, "exciton lié à un donneur") and to the intensity of the peak called FE (free exciton), which is lower in the case of the specimen produced in molten $LiNO_3$ in accordance with the invention.

This result signifies compensation of the donors present, as discussed in the document ALP 92 (2008), 141101. by I. C. Robin et al. [5].

In addition, the photoluminescence PL shows the presence of a defect band (at lower energy) with the probable, possible presence of donor-acceptor pairs. This result is also characteristic of the presence of acceptors (substitutional lithium, nitrogen or oxygen) probably incorporated during immersion of the ZnO in the molten $LiNO_3$ and able to give the desired p-type conductivity.

The invention claimed is:

1. A method comprising:
   producing a partly or completely semi-insulating or p-type doped ZnO substrate from an n-type doped ZnO substrate;
   wherein said producing comprises bringing the n-type doped ZnO substrate into contact with an anhydrous molten salt chosen from the group consisting of anhydrous molten sodium nitrate, lithium nitrate, potassium nitrate and rubidium nitrate.

2. The method according to claim 1, in which the contacting is carried out at a molten salt temperature of 264° C. to 600° C., and the salt is anhydrous lithium nitrate.

3. The method according to claim 2, in which the contacting is carried out at a molten salt temperature of 350 to 500° C.

4. The method according to claim 1, in which the contacting is carried out for a time of 5 minutes to 24 hours.

5. The method according to claim 4, in which the contacting is carried out for a time of 5 hours.

6. The method according to claim 1, in which the molten salt is subjected to a dehydration heat treatment before the contacting.

7. The method according to claim 6, in which the dehydration heat treatment is carried out prior to the contacting by bringing the molten salt up to a sufficient temperature and by keeping this sufficient temperature constant for a time sufficient for the salt to be made anhydrous.

8. The method according to claim 7, in which the sufficient temperature is 450 to 500° C., and the sufficient time is 24 to 48 hours.

9. The method according to claim 1, in which the contacting is carried out by immersing the n-type doped ZnO substrate in the molten salt.

10. The method according to claim 1, in which a surface film layer of the n-type doped ZnO substrate is converted into p-type doped ZnO.

11. The method according to claim 10, in which the surface film layer is a thin layer film with a thickness of 500 nm to 1 micron.

12. The method according to claim 1, in which the entire n-type doped ZnO substrate is converted into p-type doped ZnO.

* * * * *